United States Patent [19]
Fandrich et al.

[11] Patent Number: 5,339,320
[45] Date of Patent: Aug. 16, 1994

[54] ARCHITECTURE OF CIRCUITRY FOR GENERATING TEST MODE SIGNALS

[75] Inventors: Mickey L. Fandrich, Placerville; Jerry A. Kreifels, Citrus Heights; Virgil N. Kynett, El Dorado Hills, all of Calif.

[73] Assignee: Intel Corporation, Santa Clara, Calif.

[21] Appl. No.: 791,772

[22] Filed: Nov. 12, 1991

[51] Int. Cl.$^5$ ............................................. G01R 31/28
[52] U.S. Cl. ................................... 371/22.1; 365/201
[58] Field of Search .................... 371/22.1, 22.2, 22.3; 365/201, 230.08; 324/158 R

[56] References Cited
U.S. PATENT DOCUMENTS

| | | | |
|---|---|---|---|
| 5,115,435 | 5/1992 | Langford, II et al. | 371/22.3 |
| 5,245,577 | 9/1993 | Duesman et al. | 365/201 |

Primary Examiner—Charles E. Atkinson
Attorney, Agent, or Firm—Blakely, Sokoloff, Taylor & Zafman

[57] ABSTRACT

An arrangement for generating signals for generating a particular set of test conditions within a digital circuit including a plurality of latches for storing individual bits of data representing individual operations to be accomplished within the digital circuitry, the latches each having input and output terminals; the output terminals of each of the latches being connected to individual portions of the digital circuitry to effect an individual operation thereby; apparatus connected to the input terminals of the latches for setting individual selected ones of the latches to provide selected test conditions; and apparatus for transferring the condition of a selected number of the latches simultaneously to effect a selected test condition.

10 Claims, 5 Drawing Sheets

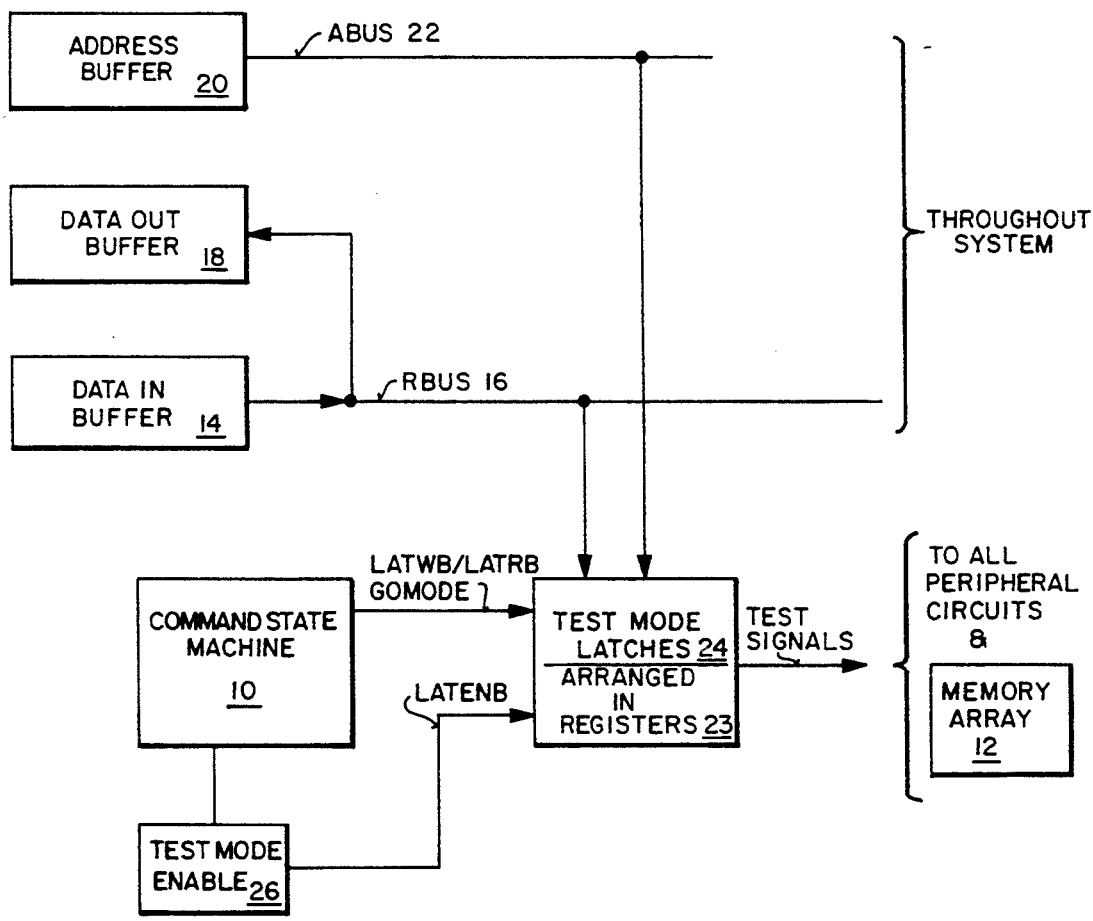
FIG_1

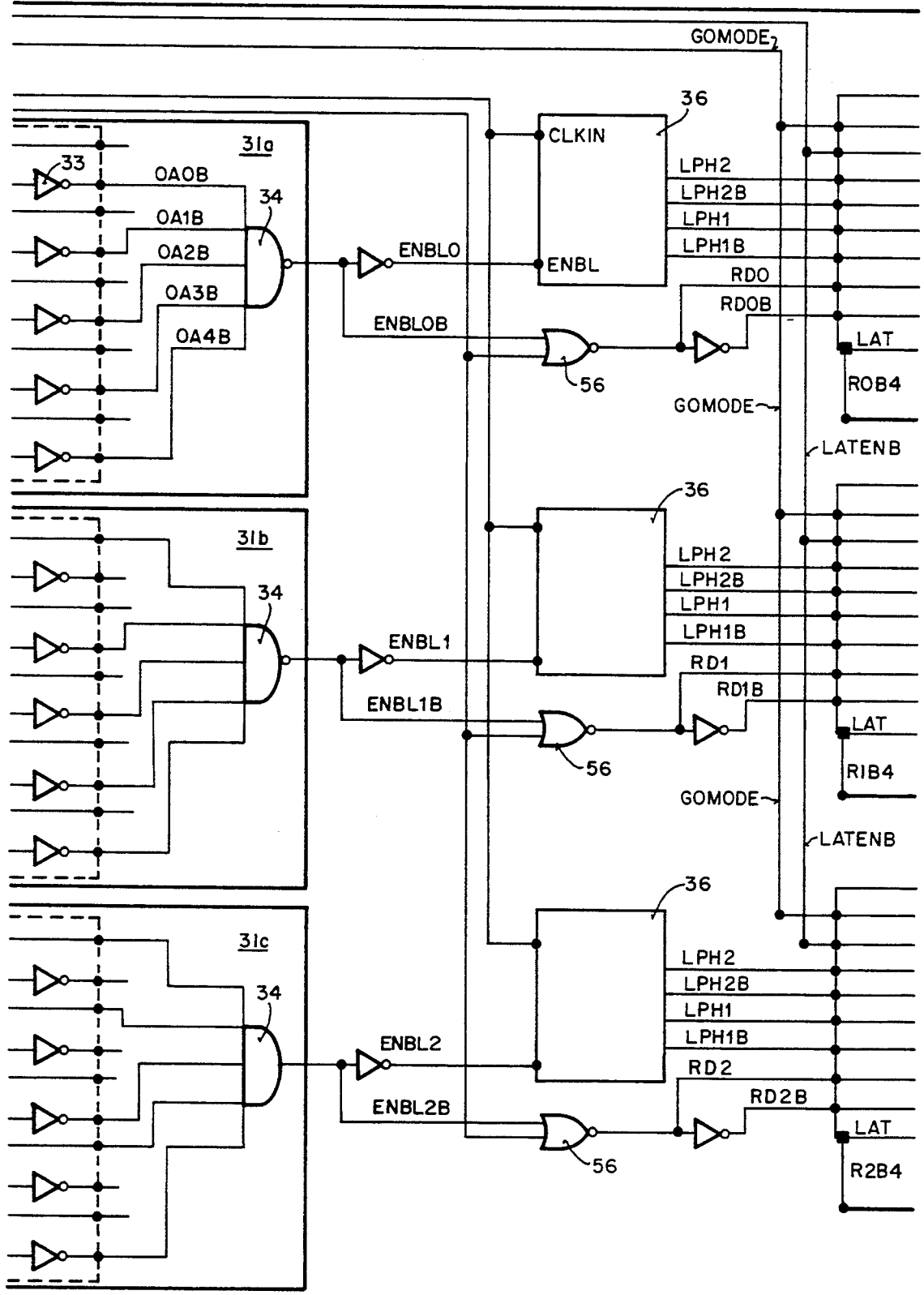
FIG_2A

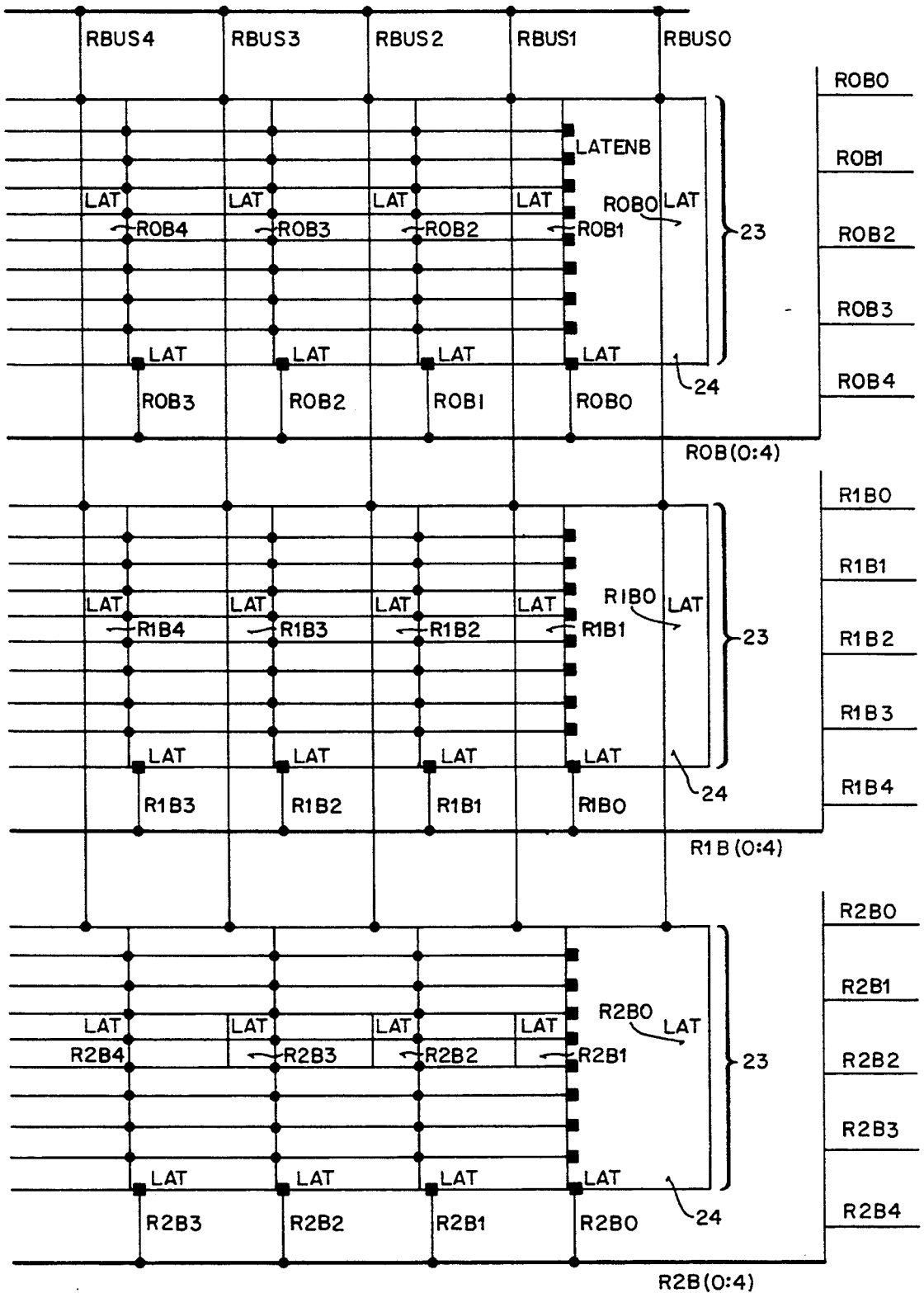
FIG_2B

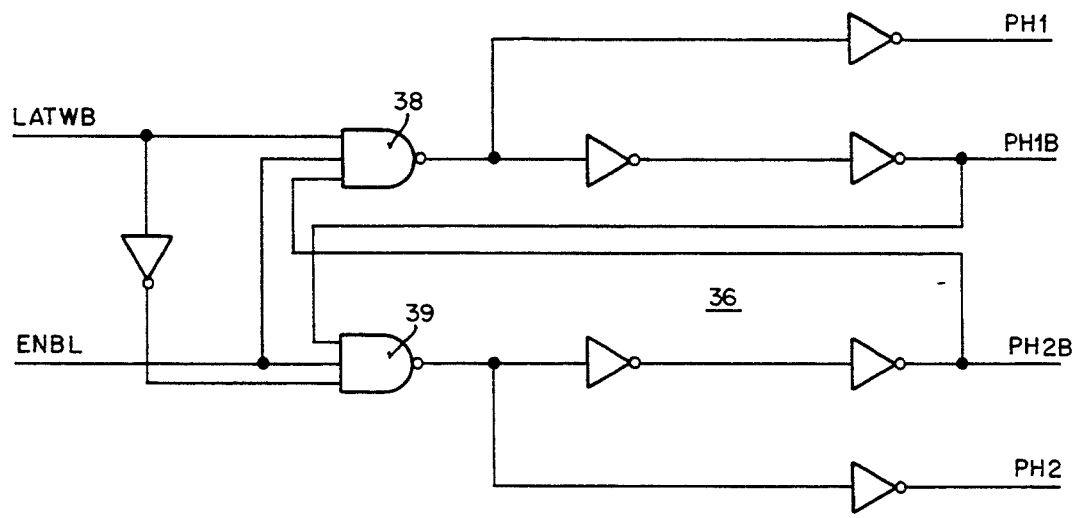
FIG_3
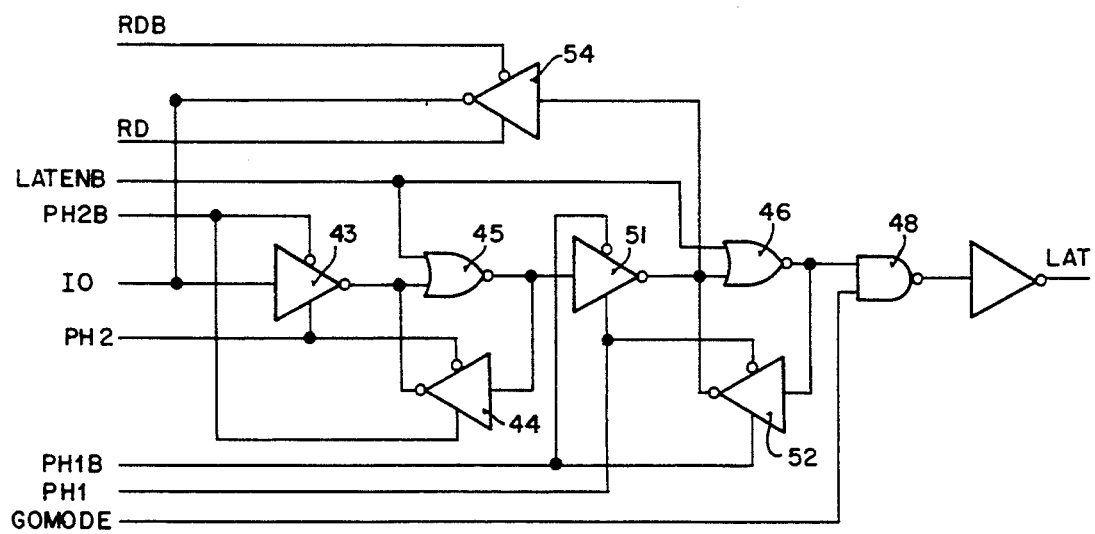
FIG_4

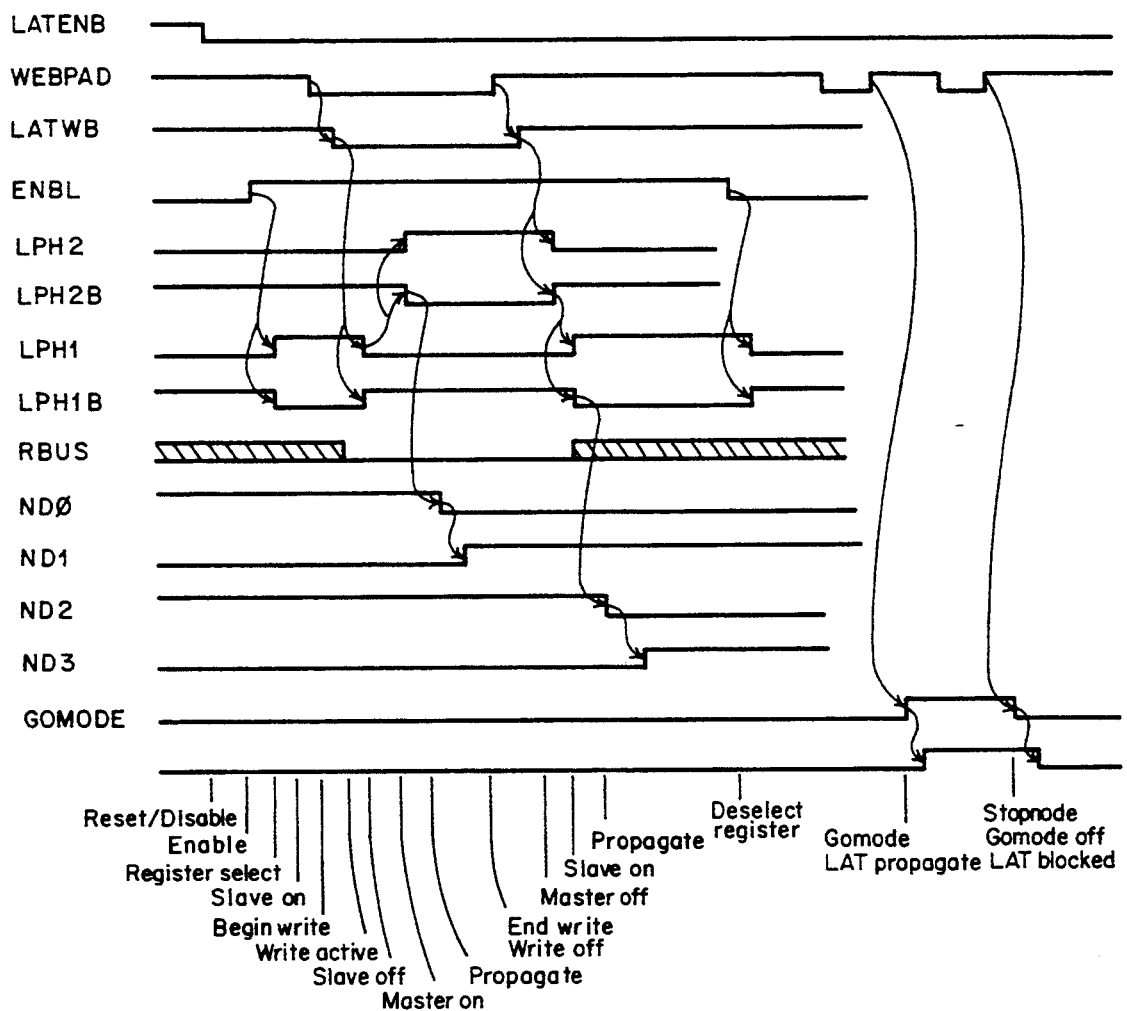
FIG_5
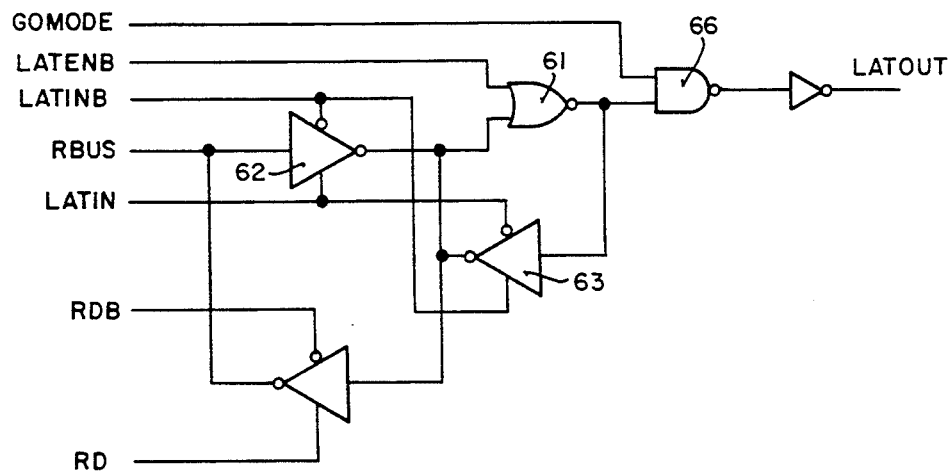
FIG_6

ARCHITECTURE OF CIRCUITRY FOR GENERATING TEST MODE SIGNALS

BACKGROUND OF THE INVENTION

1. Field of the Invention

This invention relates to computer circuitry and, more particularly, to apparatus for providing signals for testing the condition of computer circuitry.

2. History of the Prior Art

Computer circuitry becomes more and more complicated with each new improvement devised. For example, microprocessors used for desktop computers now include over a million transistors in a single integrated circuit, and more advanced processors presently in the planning stage are expected to include approximately three million transistors. With this very large number of components, the number of manufacturing defects which may cause circuit errors becomes very large. Consequently, it is necessary to subject these circuits to extensive testing prior to their release for sale and use.

The typical manner in which testing has been accomplished in prior art arrangements, is that one or more special signals are provided to one or more of the external address pins of the circuit being tested. Typically, these signals are at a higher voltage than is used for normal operating signals applied to such pins. This allows the test modes to be hidden from the typical user. The signals used for generating any particular test cause centralized circuitry within the circuit being tested to detect and decode the particular signals and generate all of the internal signals necessary for the particular test. Thus, if the characteristics of a memory array are being tested to see if the components of particular columns leak current, high voltage input signals would be applied to a few pins and detected by circuitry on the chip being tested. This would cause the centralized circuitry to generate signals which cause the bit lines of the array to be connected to external pins so that the results could be measured, other signals which cause all or a particular column of the array to be selected, and signals which cause the word lines to be turned off. These signals would produce the circuit conditions in which external signals could be provided to the array to generate results which may be measured to determine whether the particular aspect being tested is functioning correctly.

A number of problems arise from such prior art testing methods. First, there are a limited number of pins available at any time which may be used for receiving the high voltage signals to initiate the various test modes. A large number of the pins must be used for their normal purposes in order to generate the conditions being tested. For example, the pins used in addressing a particular column cannot be used for the high voltage signals to set up the tests because they must be used in the test mode to select the column to be tested. Thus, while integrated circuits have become more complex and require more testing, the pins available for this purpose have decreased. Second, the method of generating a series of signals within the circuitry being tested in response to a high voltage signal on one or a few external pins requires that centralized decoding circuitry be provided on the chip for determining the particular test required and generating all of the signals to be utilized in setting up the test conditions. Moreover, the signals produced by such circuitry must be bused from the centralized decoding circuitry throughout the circuitry being tested. This requires quite complicated decoding circuitry and very large complicated busing paths for the test signals. As the number of tests to be run increases, the size and complexity of the decoding circuitry becomes overwhelming. An additional problem of the prior art test circuitry is that requiring that all of the signals used by a particular test be produced in response to a single set of external signals means that only the test modes designed into the decoding circuitry can be utilized once the chip is designed.

It is very desirable that some arrangement be provided for testing complex integrated circuitry which allows a great number of different tests to be provided without increasing the complication of the testing circuitry. Moreover, it is desirable that new test modes be possible even though the circuitry including the test circuitry has already been designed and incorporated within the circuitry to be tested. It is also desirable that all of this be accomplished while actually reducing the complexity of the testing circuitry.

SUMMARY OF THE INVENTION

It is, therefore, an object of the present invention to provide circuitry for testing complex circuitry which allows a great number of different tests to be provided without increasing the complication of the testing circuitry.

It is another more specific object of the present invention to provide arrangements for allowing new test modes to be utilized even though the test circuitry has already been designed and incorporated within the circuitry to be tested.

It is another object of the present invention to increase the ability of test circuitry while reducing its complexity.

These and other objects of the present invention are realized in an arrangement for generating signals for producing a particular set of test conditions within a digital circuit comprising a plurality of latches for storing individual bits of data representing individual operations to be accomplished within the digital circuitry, the latches each having input and output terminals; the output terminals of each of the latches being connected to individual portions of the digital circuitry to effect an individual operation thereby; means connected to the input terminals of the latches for setting individual selected ones of the latches to provide selected test conditions; and means for transferring the condition of a selected number of the latches simultaneously to generate a selected test condition.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram useful in understanding the invention.

FIGS. 2A and 2B are partially-block, partially-schematic diagrams illustrating circuitry used in the invention.

FIG. 3 is a circuit diagram illustrating in detail a portion of the circuitry of FIGS. 2A and 2B.

FIG. 4 is a circuit diagram illustrating in detail another portion of the circuitry of FIGS. 2A and 2B.

FIG. 5 is timing diagram useful in illustrating the operation of the invention.

FIG. 6 is a circuit diagram illustrating in detail an alternate portion of the circuitry of FIGS. 2A and 2B.

DETAILED DESCRIPTION OF THE INVENTION

The present invention utilizes a unique test mode architecture for accomplishing the results desired. The preferred embodiment of the invention has been designed in the context of circuitry for controlling the reprogramming of a very complicated electrically erasable programmable memory array (particularly, a flash EEPROM array). Such an array can be reprogrammed while it remains in place within a system. However, it is necessary that the entire array be erased if any reprogramming is necessary. Because the reprogramming is so extensive, there is a substantial danger that the circuitry may be harmed by inadvertent signals generated in reprogramming. Consequently, the circuitry for reprogramming includes a command state machine which provides an interface between the user and the programmable array. The command state machine eliminates the possibility of generating spurious commands which might harm the memory array or associated circuitry. U.S. patent application Ser. No. 07/655,643, entitled COMMAND STATE MACHINE, M. Fandrich et al, filed Feb. 11, 1991, and assigned to the assignee of the present invention discloses such an arrangement. The description of that disclosure is hereby incorporated by reference in this specification.

The circuitry of the present invention departs radically from the teachings of the prior art for test arrangements. Rather than provide within the circuitry to be tested a centralized decoding circuit which receives high voltage test signals on the external pins, decodes those external signals, and generates the sequences of signals for each test mode which are bused throughout the circuitry, the present invention utilizes a plurality of individual latches which are connected to accomplish the various individual operations required to carry out each of the tests. For example, one test latch stores a single bit which may be used to select all columns in a memory array. Another test latch stores a bit which may be used to turn off the word lines to the memory array of the preferred embodiment. A third latch stores a bit which when launched connects the bit lines of the memory array to external pins on the chip so that the memory positions may be sensed. By selectively setting these test latches to store bits for causing all of the operations needed to accomplish a particular test and then sending the signals stored in the test latches simultaneously, the conditions for conducting each of the individual tests may be accomplished.

In order to select a particular test, the circuitry is placed in the test mode state; and a particular series of commands are addressed to the external pins of the integrated circuitry to set the individual latches. Typically, the test modes are known before the circuitry is developed. However, new test modes may be programmed by simply setting the correct ones of the test latches to accomplish the individual actions necessary to the particular test.

The present invention allows individual commands to be sent to set the various test latches necessary for a particular test mode operation. This eliminates the need for the decoding circuitry used to decode the high voltage signals used by prior art test circuitry. The use of test latches which store bits for causing the individual portions of operations necessary to the test operations also allows the test circuitry to be distributed throughout the circuitry to be tested rather than centralized. The individual latches may be placed close to the particular circuitry which they are to affect so that busing of the signals they produce throughout the circuit arrangement is not necessary. Furthermore, the use of the latches storing bits for causing the individual portions of operations necessary to the test operations also allows test procedures to be devised after the test circuitry has been designed. So long as the new test operation can be constructed of the individual operations for which test modes latches exist, the new test may be implemented merely by setting the correct latches for the new operation. This new test mode architecture eliminates the need for a large number of pins to pass the test mode signals to the circuitry to be tested. A single pin receives a high voltage signal to place the system in the test mode state. Thereafter, test commands are sent to the circuitry using the normal address and data buses. Consequently, any number of test commands may be implemented to fit the particular circuitry being tested (so long as latches for the individual portions of the test conditions exist when the circuitry is designed) without requiring additional pins.

Referring now to FIG. 1 there is illustrated a block diagram of circuitry discussed above in which the present invention is utilized. The circuitry includes a command state machine 10 which controls the transfer of commands and data sent to a memory array. The memory array is a flash EEPROM array although it might comprise some other sort of memory circuitry in which it is desired to eliminate the possibility of erroneous signals which might adversely affect the array. The command state machine 10 receives data from a source external to the interface circuitry through a data input buffer 14. The data input buffer 14 is connected to a data bus RBUS 16 which in the preferred embodiment of the invention includes five individual conductors for transferring five bits of data in parallel to circuitry associated with the bus 16. The bus 16 is also connected to a data out buffer 18 which transfers data from the interface circuitry to external circuitry. An address buffer 20 provides addresses from sources external to the interface circuitry to an address bus ABUS 22. The address bus 22 in the preferred embodiment of the invention includes five individual conductors for transferring five bits of data in parallel to circuitry associated with that bus. Specific details of the command state machine 10, the data input buffer 14, the data output buffer 18, the address buffer 20, and associated connecting circuitry are provided in the above-mentioned patent application entitled Command State Machine. These details are not, except as otherwise discussed here, pertinent to this invention and, consequently, are not discussed in this specification.

A plurality of test mode latches 24 which make up a number of test mode registers 23 are joined to the lines of each of the data bus 16 and the address bus 22 to receive the data which make up the test mode commands and to provide that data for transfer to various circuitry external to the interface in order to accomplish the testing of the memory array and its associated circuitry. In the preferred embodiment of the invention, fourteen individual test mode registers 23 each including five individual test mode latches 24 are provided for receiving the test mode data. Each latch 24 in each register 23 stores a single bit of data which is to be provided to the peripheral circuitry for causing a particular operation utilized in a test which determines the condition of the memory array 12. The command state machine 10 provides five commands to the test mode registers 23 which control the operation of the latches 24. The generation of these commands and the manner in which they interface with the other commands which may be provided to the command state machine 10 are discussed in depth in the aforementioned patent application.

The five test mode commands which are provided by the command state machine 10 to the registers 23 are a latch write command LATWB, a latch read command LATRB, a command GOMODE sent to initiate the transfer of data signals from all of the latches simultaneously, a command STOPMODE which terminates the output of the latches 24 simultaneously, and a command USERMODEREADS which returns the read operation from the test mode to the user modes which operate on the main array.

As outlined above, the test mode latches are physically positioned at different points on the integrated circuit arrangement which is the command state machine interface for operating the memory array. In the circuitry with which the latches are used, a test command generates the individual data bits which are stored in the test mode registers. Data may only be written to the test mode registers in groups of five bits at one time so the registers are written sequentially. However, any particular test mode command may require that data stored in a number of different test mode registers be used in a single test operation. If data were to be transferred from only one test mode register at a time, combinations of data might result at the circuitry receiving the data which were not the combinations desired. In order to assure that invalid data combinations are not generated which might harm the circuitry or the programmed array, the circuitry assures that all of the test mode latches transfer the data they contain to the circuits which are to be tested simultaneously. In this manner, inadvertent transient states (which might deleteriously affect the circuitry) do not occur. The GOMODE command is utilized with certain other signals to assure the simultaneous transfer of data from the latches 24. The details of this operation are explained hereinafter and in U.S. patent application Ser. No. 07/791,957, entitled CIRCUITRY FOR PROPAGATING TEST SIGNALS ASSOCIATED WITH A MEMORY ARRAY, M. Fandrich et al, filed on even date herewith, and assigned to the assignee of the present invention. The application Ser No. 07/791,957 was given a filing date of Nov. 13, 1991.

Also included in the arrangement with the command state machine 10 and the latches 24 is a test mode enable circuit 26. The test mode enable circuit 26 illustrated in this specification as a simple block, in fact, is a composite of certain circuitry utilized in the arrangement which is described in the aforementioned patent application.

However, for the purposes of this specification, it is only necessary to understand that the circuitry produces enabling signals for effecting appropriate timing of the operations.

In general, during the user mode of operation, a signal LATENB (the inverse of the latch enable signal) is furnished to the test mode latches 24 to hold the latches 24 in the reset condition so that they cannot be operated by the user. When test modes are enabled, the reset signal is removed so that the latches 24 are ready to receive data upon receiving a write signal LATWB.

Data is then provided to the various test mode latches 24 from the data input buffers 14 on the data bus 16. As pointed out, the latches 24 are written in groups of five, each group of which makes up one register 23. The particular registers 23 which have one or more latches 24 set to initiate an individual operation are selected by addresses furnished from the address input buffers 18 on the address bus 22. When all of the latches 24 are set for initiating the individual operations necessary to any particular test and the test is to be executed, the signal GOMODE is transferred to the latches and causes all latches 24 to generate signals simultaneously for transfer from the test mode registers 23 involved.

FIGS. 2A and 2B illustrate in partially-block form a circuit 30 including three of the test mode registers 23 which were illustrated in block form in the circuit of FIG. 1. Additional registers 23 positioned at other points on the integrated circuit are essentially identical to those illustrated in FIGS. 2A and 2B. Each register 23 has associated therewith addressing circuitry 31 used for selecting the appropriate one of the registers 23 to which data is directed. The circuitry 31 for addressing each register 23 includes a connection from each of the five conductors of the address bus ABUS 22 illustrated in FIG. 1. The signal on each conductor of the address bus is transferred as an input to a NAND gate 34. The transfer is accomplished in the upper circuit 31a for each of the bus conductors through an inverter 33. On the other hand, the next circuit 31b transfers the input signal on the upper conductor from the address bus directly to the NAND gate 34 and inverts each of the other inputs to the NAND gate 34. In a similar manner, the input signals provided from the address bus 22 are distinctly coded so that a particularly register 23 is selected by a particular address.

When all five inputs to the particular register are present in the proper state, a signal is generated by the NAND gate 34 for the particular register, inverted, and sent to a clock generating circuit 36 associated with the particular register as an enabling input. By using the addressing input as an enabling input to the clock generating circuitry, only the clock circuitry associated with the particular register is activated. Also provided as input to each of the clock generating circuits 36 is the write signal LATWB from the command state machine 10. The signal is used as an input to generate clock signals for driving the particular register 23.

FIG. 3 illustrates a single one of the clock generating circuits 36. As may be seen, the circuit 36 includes a pair of NAND gates 38 and 39. The gates each receive the enable signal generated by the addressing circuitry 31. The gate 38 also receives the LATWB write signal from the command state machine 10 as a clock input while the gate 39 receives the inverse of that write signal. Each NAND gate 38 and 39 is also connected to receive as an input a signal indicating the condition of the output of the other NAND gate 38 or 39.

In the condition in which the register is not addressed, the enable signal ENBL is at the zero level (see FIG. 5). This generates a one at the output of each of the NAND gates 38 and 39 and produces a zero as an output signal LPH1 (a slave clock), a one as an output signal LPH1B (an inverted slave clock), a zero as an output signal LPH2 (a master clock), and a one as an output signal LPH2B (an inverted master clock). The signals LPH1B and LPH2B are fed back to the inputs of the NAND gates 38 and 39 as ones. As will be seen in the following description, the zero values at each of the clocks LPH1 and LPH2 disable the input to the particular register.

When the register 23 is addressed, the enable signal ENBL becomes a one. The write signal LATWB which generates the clock signals is active low so that until a write signal appears, the NAND gate 38 provides a zero at its output. This value generates a one as the output signal LPH1 (the slave clock) and a zero as the output signal LPH1B (the inverted slave clock fed back to the NAND gate 39). At this time, the output LPH2 (master clock) is a zero; and output LPH2B (inverted master clock) is a one. When the write signal LATWB goes active, a zero is applied at the NAND gate 38 generating a one at its output and a zero at the slave clock LPH1 signal. At the same time, the write signal is inverted and applied as a one at the input to the NAND gate 39. However, the signal LPH1B fed back is initially a zero so the gate 39 does not propagate the change until the output of the NAND gate 38 has changed to a zero and been propagated back to the input of the NAND gate 39. When this happens, the NAND gate 39 furnishes a zero at its output and a one is produced as the master clock signal LPH2. Thus, the effect of the write signal is to turn off the slave clock and slightly thereafter turn on the master clock.

When the write operation is completed and the write signal LATWB goes high and inactive, a one is applied at the input to the NAND gate 38 and a zero at the input to the NAND gate 39. The gate 39 switches, generating a one at its output and producing a zero as the master clock signal LPH2.

However, the gate 38 is held off by a zero fed back as the inverted master clock signal LPH2B until the switching of the gate 39 is propagated back to its input. When the gate 38 switches, a zero is generated at its output and the slave clock becomes a one. Thus, the effect of the removal of the write signal is to turn off the master clock and slightly thereafter turn on the slave clock.

As will be seen, the slave clock and master clock signals are used for operating the individual latches 24 of the registers 23. These clock signals generated by the circuit 36 are furnished to each of the five individual latches 24 which make up the individual test mode registers 23. The clock signals are utilized to set the latch circuits 24 to the conditions determined by the input data on the input data bus RBUS 16. The data determines the condition of the latches 24. However, the data is not transferred when received by the latches 24 to the various array circuitry which responds to the test mode commands but is held in the latches until all of the registers have been filled with whatever data is to be used for each of the test operations. Then the states of the latches 24 of all of the registers 23 are propagated simultaneously. In this way, intermediate states cannot be generated which might cause the misoperation of circuitry. Consequently, the memory array and associated circuitry are protected from the generation of undesirable commands.

FIG. 4 illustrates an individual latch circuit 24. The circuit 24 is a master-slave latch. The master portion of the latch includes a pair of tristate inverters 43 and 44 and a NOR gate 45. The slave portion of the latch includes a NOR gate 46 and a pair of tristate inverters 51 and 52. Each of NOR gates 45 and 46 receives the reset input signal LATENB discussed above which is held high during periods during which the test modes are not enabled so that the latch 24 does not function. The reset signal forces the output of the NOR gate 46 low. The output of the NOR gate 46 is furnished as one the inputs to a NAND gate 48 which provides the output from the latch 24. Consequently, in the presence of the reset signal (during the normal user operating condition of the command state machine 10), no output can be provided from any of the test mode latches 24.

Moreover, it will be recalled that when test modes are not selected, both the master clock and the slave clock signals are zeroes. Consequently, the tristate inverter 43 which receives the master clock (and the inverted value of the inverted master clock) and the tristate inverter 51 which receives the slave clock (and the inverted value of the inverted slave clock) are not enabled. On the other hand, the tristate inverters 44 and 52 which receive the opposite values of both those clocks are enabled. Since the NOR gates 45 and 46 each provide a zero condition at their output terminals, a one appears at each of the inputs to the NOR gate 45 and 46 through these inverters.

Thus, when the test mode enable signal LATENB goes active low at the input to each of the NOR gates 45 and 46, a zero will continue to be furnished at the output of each of those gates because the other input to each remains a one. These zero values at the output of each of the NOR gates continue to be inverted and fed back as ones to the inputs of each of these gates 45 and 46 by the inverters 44 and 52. However, even were a one value at the output of the NOR gate 46 to appear, it would not be propagated to the output of the latch because the NAND gate 48 at the output of the latch has its input held low until the signal GOMODE appears.

It will be recalled that when a particular register 23 is addressed to produce the test mode enable signal ENBL at the clock generator circuit 36, a slave clock signal of one and a master clock signal of zero are produced. Thus, when test modes are enabled and the latch is addressed, the inverter 51 is enabled and the inverter 52 is disabled. This causes the zero at the output of the NOR gate 45 to be inverted and a one to be furnished at the input to the NOR gate 46. The one generates a zero at the output of the NOR gate 46. This signal is not fed back since the inverter 52 is disabled.

It will also be recalled that when a write enable signal is received at the clock generator 36, the slave clock which has been a one becomes a zero and shortly thereafter the master clock becomes a one. In the latch 24, when the slave clock goes to zero, the inverter 51 turns off and the inverter 52 turns on. Since the state at the output of the NOR gate 46 was a zero, a one is transferred by the inverter 52 to the input to the NOR gate 46. Thus, the value has not changed but has been stored by the slave portion of the circuit even though the inverter 51 has turned off. The master clock then turns on the inverter 43 and turns off the inverter 44. Presuming that a one is present on the data input conductor as signal IO, the one is inverted and transferred to the input of the NOR gate 45 where it is again inverted and appears as a one at the input to the inverter 51. Since the inverter 51 is off, the data is not propagated further. Thus, the condition of the slave output is maintained even though the master output has changed.

However, when the write signal is removed, the master clock assumes a zero state; and this is followed shortly by the slave clock assuming a one state. When the master clock goes to zero the inverter 43 is disabled and the inverter 44 is enabled. This causes the one condition at the output to the NOR gate 45 to be fed back as a zero at its input and maintains the one value at the output of the NOR gate 45. When the slave clock turns on the inverter 51, the one at its input is propagated as a zero to the input of NOR gate 46, and therefore a one is propagated to the output of the NOR gate 46. Since the inverter 52 is turned off by the slave clock, the value is not fed back.

Of course, each of the other four latches 24 in the addressed register is receiving input data in a similar manner. For example, one of the latches 24 may be set to a one condition while the other latches 24 are set to zeroes to select an individual operation which connects the bit lines of the memory array to the external pins. However, none of the data in any of the latches 24 is transferred to the output of the latch since the GOMODE signal is still held low and the output is disabled. Even though only a single register 23 may be addressed at any one time, the use of the GOMODE signal and the arrangement for disabling NAND gate 48 until that signal is received allows data to be stored in the latches of a register even after the write command is removed and some other register 23 is addressed to store additional data used by the test mode command to accomplish another individual operation necessary to set up the test conditions. Thus, data may be placed in all of the registers 23 needed for the particular test and none will be propagated to the output until the command is ready to execute.

At the NAND gate 48, the presence of the GOMODE signal is required before the data stored by the latch is propagated to the rest of the peripheral circuitry which is to be tested. In this manner, it is only when this GOMODE signal is received that the data is propagated. When all of the registers which are to receive data have been loaded, all of these data signals contained in the latches are propagated simultaneously to the peripheral circuitry. In this manner, all of the individual operations necessary to a particular test procedure may be initated together and intermediate states which might cause spurious conditions are not allowed to be generated by the test mode commands.

It should be noted that the master-slave arrangement of the latches 24 is especially useful where it is desired to assert or activate different test mode signals from the same register 23 in a sequence, rather than all simultaneously. For example, a series of five bits in the latches 24 of one register 23 may be used to provide a first individual test mode operation. A next test mode signal in the same register 23 may vary from the first only in the condition of one latch yet select a different individual operation. For example, a first test may select all of the columns of an array for some property to be tested. A next test may select only a single one of the columns for a similar test. A second set of signals containing this second test mode signal may be written to the master portion of the latch while the output at the slave portion of the latch remains the same until the inverter 51 is turned on. This operation may be performed while the GOMODE signal is active. The result is to keep active and valid all but the one changing bit during the process of writing that bit.

If this feature by which the condition of only a single bit is changed is not necessary to the circuitry to be tested, the individual latches 24 may each be implemented by simple D latches. Such a latch is illustrated in FIG. 6.

Also included in the latch circuit 24 is another tristate inverter circuit 54 which is enabled by the presence of a latch read command on the lines RDB and RD for transferring the condition at the output of the slave tristate inverter 51 to the data bus. It will be noted that the read signals are provided through NOR gates 56 illustrated in FIG. 2 and are only activated when the address bus selects that particular register 23.

In a manner similar to the application of the GOMODE signal for transferring the test mode signals throughout the array and other circuitry, a test mode stop signal STOPMODE generated by the command state machine terminates the GOMODE signal and terminates the transfer of test mode signals simultaneously. This also assists in preventing extraneous and undesirable test mode signals from being propagated through the peripheral circuitry.

When a master/slave latch is not required, the latch 60 of FIG. 6 may be utilized. The latch circuit 60 includes a NOR gate 61 which receives the reset input signal LATENB. The signal LATENB disables output from the latch during the normal user condition on the command state machine 10. The simple latch 60 does not required master and slave clock signals so LATIN and LATINB signals are generated (rather than master/slave clock signals) by the addressing signals. The LATIN signal (and the inverted LATINB) selects the particular latch by enabling a tristate inverter 62 to transfer the data signal on the RBUS addressed to that latch 60. The signal is inverted and transferred by the NOR gate 61 to its output terminal. A second tristate inverter 63 stores the value written to the latch at the input to the NOR gate 61 when the LATIN and LATINB signals are reversed in polarity. The value at the output of the NOR gate 61 is then available for transfer by a NAND gate 66 upon receipt of the GOMODE signal in a fashion similar to the circuit described above.

Thus, the operation of the circuitry to implement the test conditions to carry out a particular test is as follows. In the typical user modes of operation of the command state machine, a reset condition is applied to all of the test mode latches 24 to hold them in the inoperative condition so that they cannot be activated by the user. A high voltage test mode enable signal provided on an external pin causes the command state machine to remove the reset condition. Presuming that a single column leaky column test of the array is to be conducted, three individual operations are required to set up the test. The word lines of the array must be disabled, the bit lines must be connected to the data pads, and the sense amplifier circuits of the array must be turned off. To cause these individual operations, a command is placed on the external pins which are the command port to cause the command state machine to generate a test latch write signal which initiates the write operation. The address and data for the first of the individual operations (e.g., disconnect the word lines) are placed on external address and data pins connected to the data bus and the address bus so that the data is directed to the addressed register 23 including the latches 24 which control this operation. In the preferred embodiment, only a single latch of a single register 23 is set for this operation. This causes the addressed latches 24 to be placed in the appropriate condition to initiate the disconnect word lines operation. Another test latch write command is then issued to the command port pins so that the command state machine issues the test latch write signal. Again, address and data for the next of the individual operations (e.g., the bit lines are connected to the data pads) may be placed on external address and data pins connected to the data bus and the address bus so that the data is directed to the addressed register 23 including the latches 24 which control this operation. In the preferred embodiment, however, the register 23 which controls the connection of the bit lines to the external circuitry is the same register 23 which controls the turn off of the sense amplifier circuits of the array. Consequently, the two data signals to set two different latches 24 of the same register 23 may be included in the same data to be written so that two latches 24 of a single register 23 are set for this operation. Setting these two latches 24 prepares the register to provide output signals from those latches 24 which will accomplish the two individual operations. Finally, a test mode go signal causes the output of each of the latches 24 of both of the registers 23 to be placed simultaneously on the conductors to the array circuitry at which the signals are utilized. Once the particular test mode conditions have been implemented, particular voltage levels are placed on the external pins addressed to the column to be tested and the current through the bit lines is sensed. Finally, to get out of the test mode, a test mode stop signal is placed on the command port pins so that the command state machine terminates the test mode go signal and the outputs of the latches of all of the registers are removed simultaneously. In this manner, extraneous test mode signals are eliminated.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An arrangement for generating signals for causing a particular set of test conditions within a digital circuit, comprising:

a plurality of latches for storing individual bits of data representing the test conditions to be accomplished within the digital circuit, the latches each having input and output terminals;

the output terminals of each of the latches being connected to individual portions of the digital circuit to effect the test conditions;

means connected to the input terminals of the latches for setting individual selected ones of the latches to provide the test conditions.

2. An arrangement for generating signals for causing a particular set of test conditions within a digital circuit as claimed in claim 1 in which the latches are grouped in registers and the registers are distributed throughout the digital circuit.

3. An arrangement for generating signals for causing a particular set of test conditions within a digital circuit as claimed in claim 2 in which the registers are grouped adjacent a portion of the digital circuit to be controlled.

4. An arrangement for generating signals for causing a particular set of test conditions within a digital circuit as claimed in claim 2 in which each of the plurality of latches comprises a master portion and a slave portion, and means for placing the master portion in a particular condition without changing the condition of the slave portion.

5. An arrangement for generating signals for causing a particular set of test conditions within a digital circuit as claimed in claim I in which the digital circuit includes an address bus and a data bus and in which the means connected to the input terminals of the latches for setting individual selected ones of the latches to provide the test conditions are connected to the address bus and the data bus of the digital circuit.

6. An arrangement for generating signals for causing a particular set of test conditions within a digital circuit as claimed in claim 5 in which the latches are grouped in registers and the registers are distributed throughout the digital circuit.

7. An arrangement for generating signals for causing a particular set of test conditions within a digital circuit as claimed in claim 6 in which each of the plurality of latches comprises a master portion and a slave portion, and means for placing the master portion in a particular condition without changing the condition of the slave portion.

8. An arrangement for generating signals for causing a particular set of test conditions within a digital circuit as claimed in claim 1 in which each of the plurality of latches comprises a master portion and a slave portion, and means for placing the master portion in a particular condition without changing the condition of the slave portion.

9. An arrangement for generating signals for causing a particular set of test conditions within a digital circuit as claimed in claim 1 in which each of the plurality of latches comprises a D latch.

10. An arrangement for generating signals for causing a particular set of test conditions within a digital circuit, comprising:

a plurality of latches for storing individual bits of data representing the test conditions to be accomplished within the digital circuit, the latches being grouped in a plurality of registers distributed throughout the digital circuit;

output terminals from each of the latches connected to individual portions of the digital circuit to effect the test conditions whereby a plurality of such test conditions create a particular test mode;

means for addressing individual ones of the latches using a standard system address bus for setting individual selected ones of the latches to provide a selected test condition; and means for placing data on a standard system data bus to place addressed ones of the latches in the selected test condition which generate the particular test mode.

* * * * *